United States Patent [19]

Hawkins et al.

[11] Patent Number: 4,601,777

[45] Date of Patent: Jul. 22, 1986

[54] THERMAL INK JET PRINTHEAD AND PROCESS THEREFOR

[75] Inventors: William G. Hawkins, Webster; Donald J. Drake, Rochester; Michael R. Campanelli, Webster, all of N.Y.

[73] Assignee: Xerox Corporation, Stamford, Conn.

[21] Appl. No.: 719,410

[22] Filed: Apr. 3, 1985

[51] Int. Cl.$^4$ .................. H01L 21/306; B44C 1/22; C03C 15/00; C23F 1/02

[52] U.S. Cl. .................. 156/626; 156/633; 156/634; 156/644; 156/651; 156/653; 156/656; 156/657; 156/659.1; 156/662; 156/901; 156/647; 346/1.1; 346/140 R

[58] Field of Search ............ 156/626, 629, 633, 634, 156/643, 647, 644, 646, 653, 656, 657, 651, 659.1, 662, 901, 902; 430/313; 346/1.1, 140 R

[56] References Cited

U.S. PATENT DOCUMENTS

| | | | |
|---|---|---|---|
| 4,106,976 | 8/1978 | Chiou et al. | 156/644 |
| 4,157,935 | 6/1979 | Solyst | 156/644 |
| 4,275,290 | 6/1981 | Cielo et al. | 219/216 |
| 4,362,599 | 12/1982 | Imaizumi et al. | 156/647 |
| 4,438,191 | 3/1984 | Cloutier et al. | 430/324 |
| 4,463,359 | 7/1984 | Ayata et al. | 346/1.1 |
| 4,468,282 | 8/1984 | Neukermans | 156/633 |

FOREIGN PATENT DOCUMENTS

051160  10/1974  Japan .

OTHER PUBLICATIONS

IBM Tech. Disclosure Bulletin, vol. 21, No. 6, Nov. 1978, Title, "Two-Sided Groove Etching Method to Produce Silicon Ink Jet Nozzles"; Authors: T. S. Kuan et al.

Article, "Fabrication of Novel Three-Dimensional Microstructures by the Anisotropic Etching of (100) and (110) Silicon", in the IEEE Transactions on Electron Devices, vol. ED-25, No. 10 (Oct. 1978) by Ernest Bassous.

Primary Examiner—William A. Powell
Attorney, Agent, or Firm—Robert A. Chittum

[57] ABSTRACT

Several fabricating processes for ink jet printheads are disclosed, each printhead being composed of two parts aligned and bonded together. One part is a substantially flat substrate which contains on the surface thereof a lineal array of heating elements and addressing electrodes, and the second part is a substrate having at least one recess anisotropically etched therein to serve as an ink supply manifold when the two parts are bonded together. A lineal array of parallel grooves are formed in the second part, so that one end of the grooves communicate with the manifold recess an the other ends are open for use as an ink droplet expelling nozzles. Many printheads can be made simultaneously by producing a plurality of sets of heating elements array with their addressing electrodes on a silicon wafer and by placing alignment marks thereon at predetermined locations. A corresponding plurality of sets of channels and associated manifolds are produced in a second silicon wafer and, in one embodiment, alignment openings are etched thereon at predetermined locations. The two wafers are aligned via the alignment openings and alignment marks, then bonded together and diced into many separate printheads. A number of printheads can be fixedly mounted in a pagewidth configuration which confronts a moving recording medium for pagewidth printing or individual printheads may be adapted for carriage type ink jet printing.

20 Claims, 16 Drawing Figures

THERMAL INK JET PRINTHEAD AND PROCESS THEREFOR

BACKGROUND OF THE INVENTION

1. Field of the Invention

This invention relates to thermal ink jet printing, and more particularly to a thermal ink jet printhead and process for fabricating it.

2. Description of the Prior Art

Generally speaking, drop-on-demand ink jet printing systems can be divided into two types. The type using a piezoelectric transducer to produce a pressure pulse that expells a droplet from a nozzle or the type using thermal energy to produce a vapor bubble in an ink-filled channel that expels a droplet. This latter type is referred to as thermal ink jet printing or bubble ink jet printing and is the subject matter of the present invention. In existing thermal ink jet printing, the printhead comprises one or more ink filled channels, such as disclosed in U.S. Pat. No. 4,463,359 to Ayata et al, communicating with a relatively small ink supply chamber at one end and having an opening at the opposite end, referred to as a nozzle. A thermal energy generator, usually a resistor, is located in the channels near the nozzle a predetermined distance therefrom. The resistors are individually addressed with a current pulse to momentarily vaporize the ink and form a bubble which expels an ink droplet. As the bubble grows, the ink bulges from the nozzle and is contained by the surface tension of the ink as a meniscus. As the bubble begins to collapse, the ink still in the channel between the nozzle and bubble starts to move towards the collapsing bubble, causing a volumetric contraction of the ink at the nozzle and resulting in the separating of the bulging ink as a droplet. The acceleration of the ink out of the nozzle while the bubble is growing provides the momentum and velocity of the droplet in a substantially straight line direction towards a recording medium, such as paper.

In U.S. Pat. No. 4,463,359, a thermal ink jet printer is disclosed having one or more ink-filled channels which are replenished by capillary action. A meniscus is formed at each nozzle to prevent ink from weeping therefrom. A resistor or heater is located in each channel at a predetermined distance from the nozzles. Current pulses representative of data signals are applied to the resistors to momentarily vaporize the ink in contact therewith and form a bubble for each current pulse. Ink droplets are expelled from each nozzle by the growth of the bubbles which causes a quantity of ink to bulge from the nozzle and break off into a droplet at the beginning of the bubble collapse. The current pulses are shaped to prevent the meniscus from breaking up and receding too far into the channels, after each droplet is expelled. Various embodiments of linear arrays of thermal ink jet devices are shown such as those having staggered linear arrays attached to the top and bottom of a heat sinking substrate and those having different colored inks for multicolored printing. In one embodiment, a resistor is located in the center of a relatively short channel having nozzles at both end thereof. Another passageway is connected to the open-ended channel and is perpendicular thereto to form a T-shaped structure. Ink is replenished to the open-ended channel from the passageway by capillary action. Thus, when a bubble is formed in the open-ended channel, two different recording mediums may be printed simultaneously.

U.S. Pat. No. 4,275,290 to Cielo et al discloses a thermally activated liquid ink printing head having a plurality of orifices in a horizontal wall of an ink reservoir. In operation, an electric current pulse heats selected resistors that surround each orifice and vaporizes the nonconductive ink. The vapor condenses on a recording medium, such as paper, spaced above and parallel to the reservoir wall, causing a dark or colored spot representative of a picture element or pixel. Alternatively, the ink may be forced above the orifice by partial vaporization of the ink, so that the ink is transported by a pressure force provided by vapor bubbles. Instead of partially or completely vaporizing the ink, it can be caused to flow out of the orifices by reduction of the surface tension of the ink. By heating the ink in the orifices, the surface tension coefficient decreases and the meniscus curvature increases, eventually reaching the paper surface and printing a spot. A vibrator can be mounted in the reservoir to apply a fluctuating pressure to the ink. The current pulse to the resistors are coincident with the maximum pressure produced by the vibration.

Japanese patent application No. 51160 filed in Japan on May 10, 1974 by Hitachi, Ltd. and published after examination as Publication No. 56-007874 on Feb. 20, 1981 discloses a method of manufacturing an ink jet nozzle plate having one or more nozzles or orifices therein. The method comprises growing a high resistance silicon single crystal layer on a low resistance silicon single crystal substrate, masking the high resistance silicon crystal with silicon nitride ($Si_3N_4$) having a photo-etched pattern of the conical orifice to be produced, etching the high resistance silicon with a crystal axis-dependent etching solution to form a conical hole therein, oxidizing the surface of the high resistance silicon, and removing the low resistance silicon.

U.S. Pat. No. 4,362,599 to Imaizumi et al discloses a method of preparing a high-voltage, semiconductor device. The semiconductor device is prepared by forming a silicon substrate of one conductor type having a surface of the (100) crystal plane, opening a rectangular window having sides parallel to the (100) crystal axis, etching the interior of the rectangular window with an anisotropic etching solution to form a recess or dent in the silicon substrate, removing the oxide film and growing an epitaxial layer of silicon having a conductor type opposite to that of the substrate over the entire substrate surface, and masking the recess and etching the epitaxial layer with an anisotropic etching solution to flatten the surface of the epitaxial layer. The remainder of the semiconductor device is produced on the flattened epitaxial layer. U.S. Pat. No. 4,106,976 to Chiou et al discloses a method of fabricating a nozzle array structure comprising the steps of forming a uniformed layer of inorganic membrane material, such as silicon dioxide or silicon nitride, on the planar surface of a monocrystalline substrate, such as silicon, preferential etching the substrate from the surface opposite the one with the membrane to form an array of openings therethrough, and etching the membrane to form orifices coaxially with the substrate openings. The substrate surfaces are parallel and oriented in the (100) crystallographic direction.

U.S. Pat. No. 4,157,935 to Solyst discloses a method of producing nozzle arrays for ink jet printers from silicon wafers that do not have parallel surfaces. The method comprises exposing the wafer to a light source through a mask, wherein columnar light from the light source is directed toward the wafer at a predetermined angle with respect to the wafer structure and relative motion between the light source and the wafer is produced; treating the wafer to render it subject to anisotropic etching only in the non-exposed areas; and anisotropically etching the wafer to produce uniform orifices corresponding to the mask.

IBM Technical Disclosure Bulletin, Vol. 21, No. 6 dated November 1978 discloses differential etching of mutually perpendicular grooves in opposite surfaces of a (100) oriented silicon wafer. An array of nozzles is formed when the depth of the grooves is equal to one-half of the thickness of the wafer.

An article entitled "Fabrication of Novel Three-Dimensional Microstructures by the Anisotropic Etching of (100) and (110) Silicon by Ernest Bassous, IEEE Transactions on Electron Devices, Vol. ED-25, No. 10, dated October 1978 discusses the anisotropic etching of single crystal silicon of (100) and (110) orientation and the fabrication of three types of microstructures; viz., (1) a high-precision circular orifice in a thin membrane for use as an ink jet nozzle, (2) a multisocket miniature electrical connector with octohedral cavities suitable for cryogenic applications, and (3) multichannel arrays in (100) and (110) silicon. To make some of these structures, a novel bonding technique to fuse silicon wafers with phosphosilicate glass films was developed. The membrane-type nozzles with circular orifices were fabricated by anisotropic etching of holes in combination with a process which takes advantage of the etch resistance of heavily doped p+ silicon in the etchant.

U.S. Pat. No. 4,438,191 to Cloutier et al discloses a method of making a monolithic bubble-driven ink jet printhead which eliminates the need for using adhesives to construct multiple part assemblies. The method provides a layered structure which can be manufactured by standard integrated circuit and printed circuit processing techniques. Basically, the substrate with the bubble generating resistors and individually addressing electrodes have the ink chambers and nozzles integrally formed thereon by standard semiconductor processing.

SUMMARY OF THE INVENTION

It is an object of the present invention to provide an ink jet printhead for high resolution printing that is more cost effective to manufacture by allowing the concurrent fabrication of large quantities of printheads from two substrates that are preferably silicon wafers.

It is another object of this invention to provide a printhead composed of two parts which are accurately aligned with each other and bonded together.

It is still another object of this invention to form a plurality of sets of bubble generating heating elements and their addressing electrodes on one substrate and to form a corresponding plurality of sets of ink channels and their ink supplying manifolds on another substrate via anisotropic etching.

It is yet another object of this invention to provide means for accurately aligning each of the plurality of sets of channels and their associated manifolds with a corresponding set of heating elements so that the two substrates may be bonded together and diced to produce a plurality of individual printheads.

It is still a further object of this invention to provide a method of batch fabricating sets of channels and their associated manifolds wherein the channels are of highly uniform size and shape with a pitch or center-to-center spacing corresponding to a pixel density of up to 1000 spots per inch (spi).

In the present invention, a plurality of ink jet printheads are fabricated from two (100) silicon wafers. In the preferred embodiment, the printheads are of the thermal, drop-on-demand type and adapted for carriage printing. A plurality of sets of heating elements and their individually addressing electrodes are formed on a surface of one of the wafers, and a corresponding plurality of sets of parallel channels, each channel set communicating with a manifold, are anisotropically etched in a surface of the other wafer. A fill hole and alignment openings are etched in the other surface of the wafer with the channels. Alignment marks are formed at predetermined locations on the wafer surface having the heating elements. The wafer surface with the channels are aligned with the heating elements via the alignment openings and alignment marks and bonded together. A plurality of individual printheads are obtained by dicing the two bonded wafers. Each printhead is fixedly positioned on one edge of an L-shaped electrode or daughter board with the manifold fill hole exposed, so that the channel nozzles are parallel to the daughter board edge. The printhead electrodes are wire-bonded to corresponding electrodes on the daughter board. The daughter board with printhead is mounted on an ink supply cartridge. The ink cartridge may optionally be disposable. The printhead fill hole is sealingly positioned over and coincident with an aperture in the cartridge in order that ink may fill and maintain ink in the printhead manifold and communicating capillary-filled ink channels.

The printhead, daughter board, and cartridge combination may, for example, be mounted on a carriage of an ink jet printer that is adapted for reciprocation across the surface of a recording medium, such as paper. The paper is stepped a predetermined distance each time the printhead's reciprocating direction is reversed to print another line. The array of printhead nozzles in this configuration are parallel to the direction of movement of the recording medium and perpendicular to the direction of traversal of the carriage. Current pulses are selectively applied to the heating elements in each channel from a controller in the printer in response to receipt of digitized data signals by the controller. In a page-width array configuration, of course, the array is fixed and oriented perpendicular to the direction of movement of the recording medium. During the printing operation, the recording medium continually moves at a constant velocity.

The current pulses cause the heating elements to transfer thermal energy to the ink which, as is well known in the art, vaporizes the ink and momentarily produces a bubble. The heating element cools after the passage of the current and the bubble collapses. The nucleation and expansion of the bubble forms an ink droplet and propels it towards the recording medium.

DESCRIPTION OF THE PREFERRED EMBODIMENT

Figure 1:
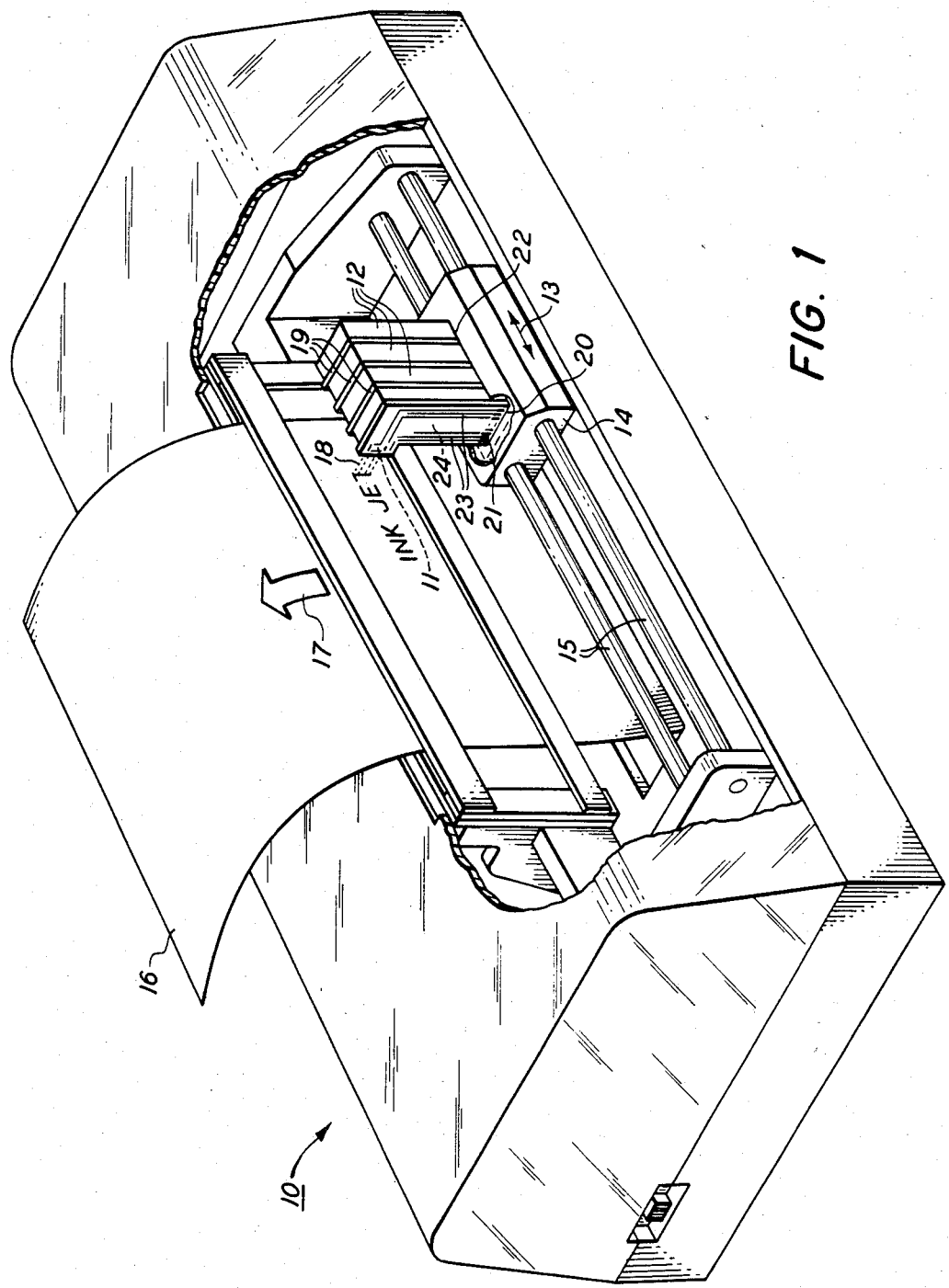
FIG. 1 is a schematic isometric view of a carriage type thermal ink jet printing system incorporating the present invention.

A typical carriage type, multicolor, thermal ink jet printing device 10 is shown in FIG. 1. A linear array of ink droplet producing channels is housed in each printhead 11 of each ink supply cartridge 12 which may optionally be disposable. One or more ink supply cartridges are replaceably mounted on a reciprocating carriage assembly 14 which reciprocates back and forth in the direction of arrow 13 on guide rails 15. The channels terminate with orifices or nozzles aligned perpendicular to the carriage reciprocating direction and parallel to the stepping direction of the recording medium 16, such as paper. Thus, the printhead prints a swath of information on the stationary recording medium as it moves in one direction. Prior to the carriage and printhead reversing direction, the recording medium is stepped by the printing device a distance equal to the printed swath in the direction of arrow 17 and then the printhead moves in the opposite direction printing another swath of information. Droplets 18 are expelled and propelled to the recording medium from the nozzles in response to digital data signals received by the printing device controller (not shown), which in turn selectively addresses the individual heating elements, located in the printhead channels a predetermined distance from the nozzles with a current pulse. The current pulses passing through the printhead heating elements vaporize the ink contacting the heating eleents and produce temporary vapor bubbles to expel droplets of ink from the nozzles. Alternatively, several printheads may be accurately juxtapositioned to form a pagewidth array of nozzles. In this configuration (not shown), the nozzles are stationary and the paper moves therepast.

In FIG. 1, several ink supply cartridges 12 and fixedly mounted electrode boards or daughter boards 19 are shown in which each sandwich therebetween a printhead 11, shown in dashed line. The printhead is permanently attached to the daughter board and their respective electrodes are wire-bonded together. A printhead fill hole, discussed more fully later, is sealingly positioned against and coincident with an aperture (not shown) in the cartridge, so that ink from the cartridge is continuously supplied to the ink channels via the manifold during operation of the printing device. This cartridge is similar to and more fully described in U.S. patent application Ser. No. 677,426 filed Dec. 3, 1984 by Ivan Rezanka and assigned to the same assignee as this application. Accordingly, U.S. application Ser. No. 677,426 is incorporated herein by reference. Note that the lower portion 20 of each daughter board 19 has electrode terminals 21 which extend below the cartridge bottom 22 to facilitate plugging into a female receptacle (not shown) in the carriage assembly 14. In the preferred embodiment, the printhead contains 48 channels on 3 mil centers for printing with a resolution of 300 spots per inch (spi). Such a high density of addressing electrodes 23 on each daughter board is more conveniently handled by having some of the electrodes terminate on both sides. In FIG. 1, the side 24 shown is opposite the one containing the printhead. The electrodes all originate on the side with the printhead, but some pass through the daughter board. All of the electrodes 23 terminate at daughter board end 20.

Figure 2:
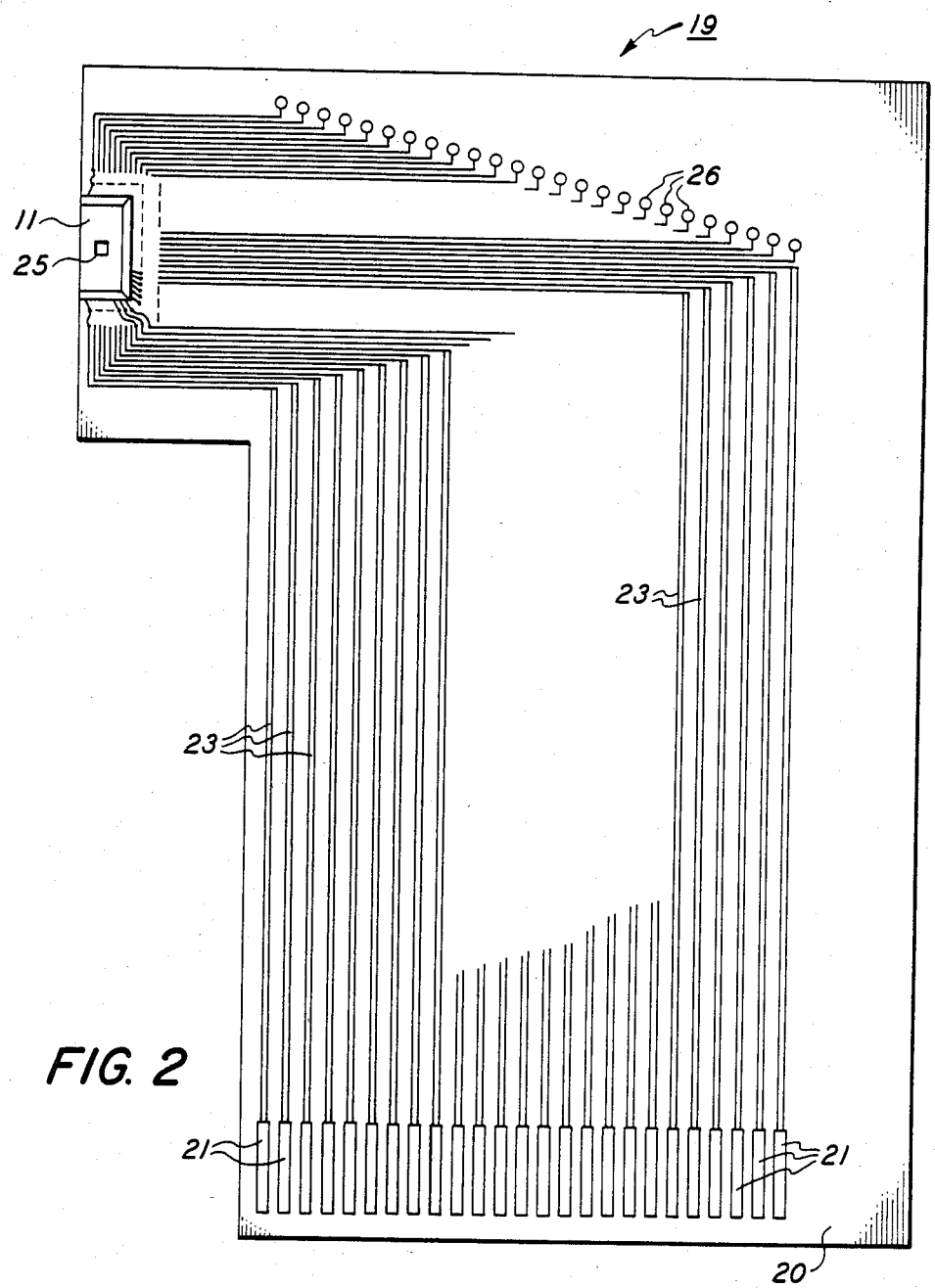
FIG. 2 is a plan view of the daughter board and fixedly mounted printhead showing the electrodes terminals of the printhead wire-bonded to one end of the electrodes of the daughter board.
Figure 3:
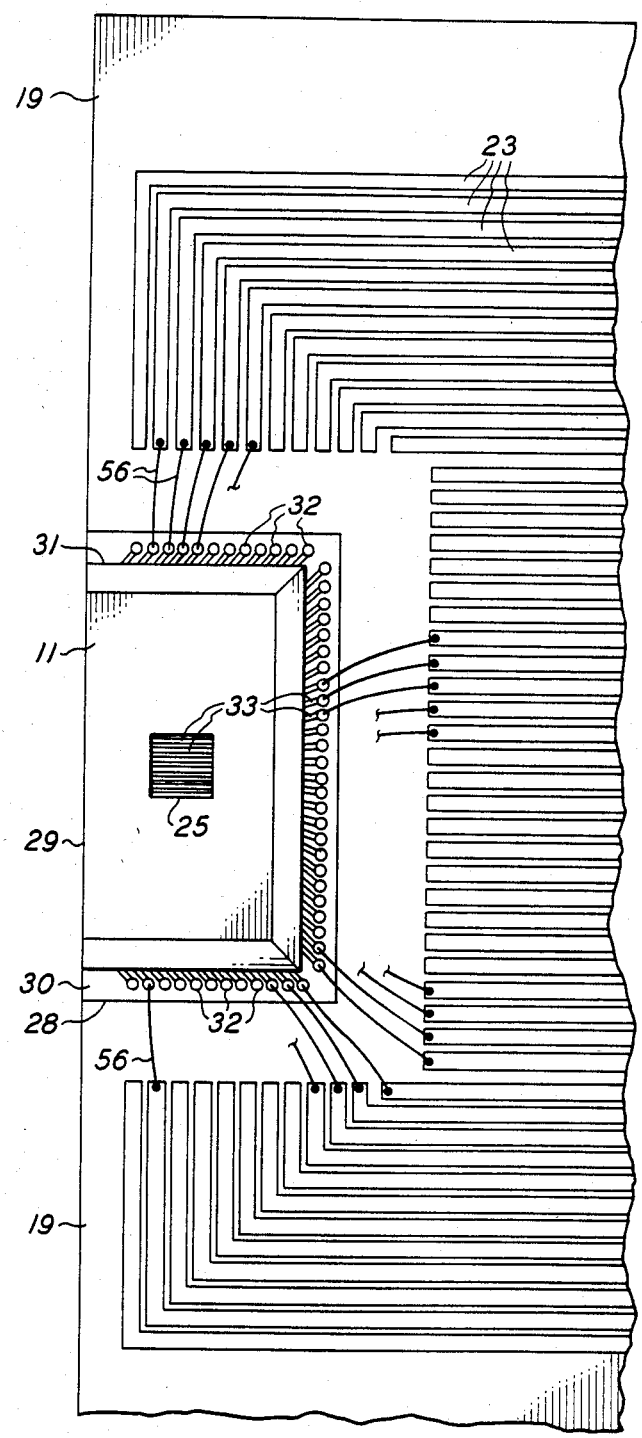
FIG. 3 is an enlarged plan view of the printhead attached to the daughter board as shown in FIG. 2.

A plan view of the L-shaped daughter board 19 is shown in FIG. 2. This view is of the side containing the printhead 11. The daughter board electrodes 23 are on a one-to-one ratio with the electrodes of the printhead and are wire-bonded thereto as better shown in FIG. 3 and described later. The printhead fill hole 25 is readily apparent in this FIG. 2. About half of the daughter board electrodes 23 which are on the longer leg of the daughter board are on the opposite surface thereof so that both sides of the daughter board end portion 20 have substantially identical parallel arrays of terminals 21. The electrodes on the opposite side of the daughter board are electrically connected through the daughter board at locations 26. An enlarged, plan view of the printhead 11 of FIG. 2 is shown in FIG. 3 bonded to the daughter board 19 with the printhead electrode terminals 32 wire-bonded to one end of the daughter board electrodes 23. The wire bonds 56 are installed automatically by any standard wire bonding machine.

Figure 4:
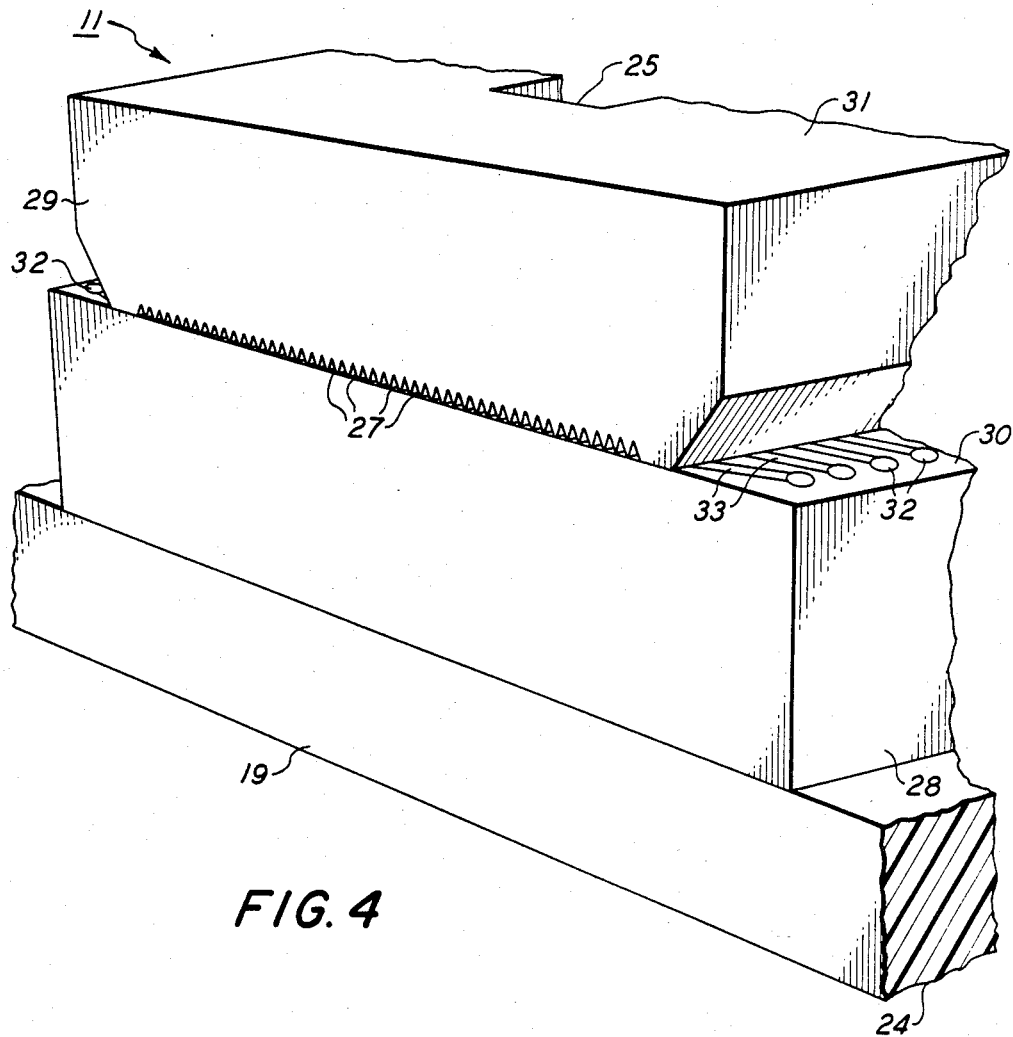
FIG. 4 is an enlarged isometric view of a printhead mounted on the daughter board showing the ink droplet emitting nozzles.

FIG. 4 is an enlarged schematic isometric view of the front face of the printhead 11 showing the array of droplet emitting nozzles 27. The lower electrically insulated substrate 28 has the heating elements (not shown) and addressing electrodes 33 patterned on the surface 30 thereof, while the upper substrate 31 has parallel triangular cross-sectional grooves which extend in one direction and penetrate through the upper substrate front edge 29. The other end of the grooves communicate with a common internal recess, not shown in this Figure. The floor of the internal recess has an opening therethrough for use as an ink fill hole 25. The surface of the upper substrate with the grooves are aligned and bonded to the lower substrate 28 as described later, so that a respective one of the plurality of heating elements is positioned in each channel, formed by the grooves and the lower substrate. Ink enters the manifold formed by the recess and the lower substrate through the fill hole and, by capillary action, fills the channels. The ink at each nozzle forms a meniscus, the surface tension of which prevents the ink from weeping therefrom. The addressing electrodes 33 on the lower substrate 28 terminate at terminals 32. The upper substrate or channel plate 31 is smaller than that of the lower substrate or heating element plate 28 in order that the electrode terminals 32 are exposed and available for wire-bonding to the electrodes of the daughter boards, on which this printhead 11 is permanently mounted.

Figure 5:
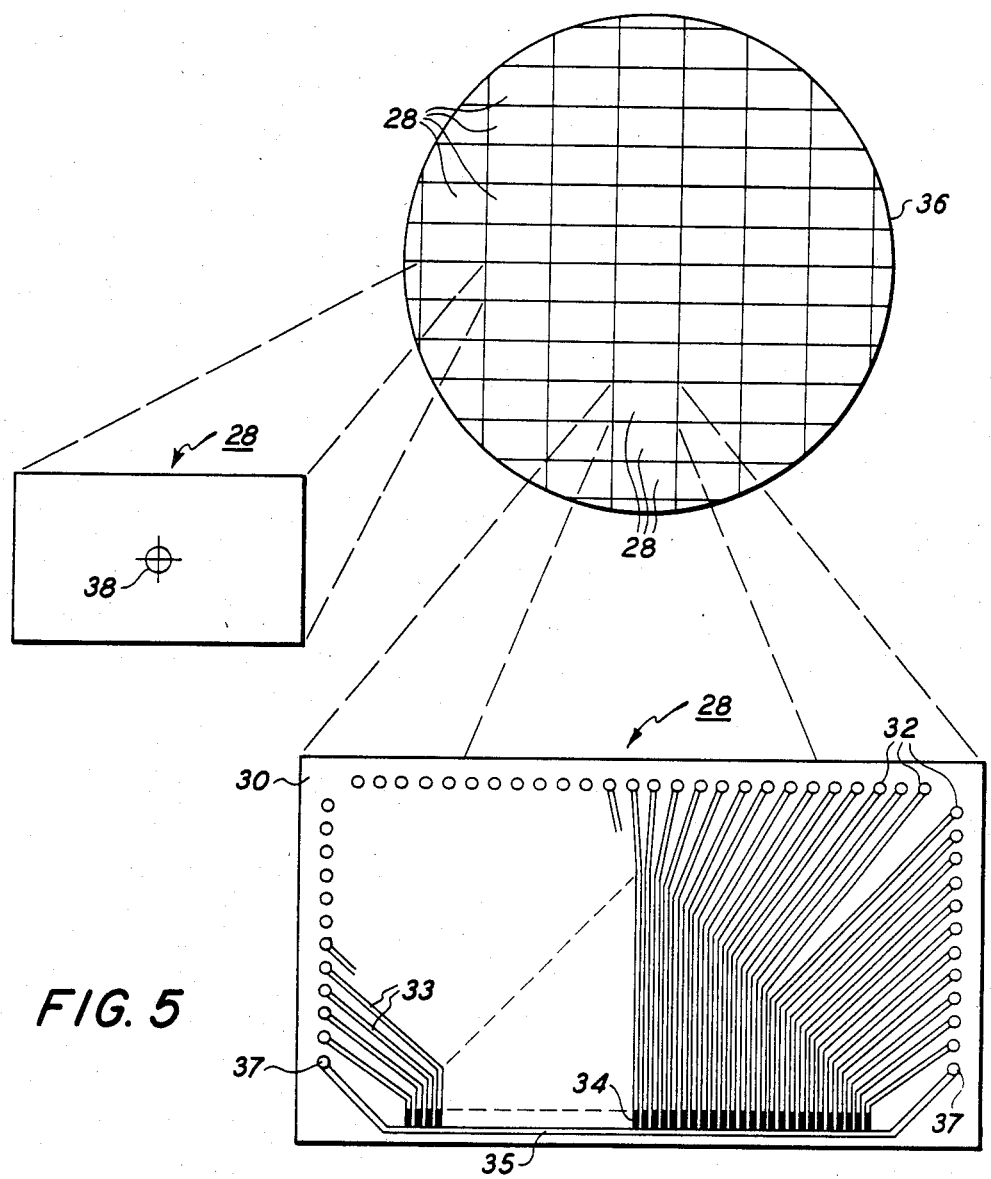
FIG. 5 is a schematic plan view of a wafer having a plurality of heating element arrays and addressing electrodes, with one heating element array and one alignment mark being shown enlarged.

In FIG. 5, a plurality of sets of bubble-generating, heating elements 34 and their addressing electrodes 33 are patterned on the polished surface of a single-side-polished, (100) silicon wafer 36. One set of heating elements 34 and addressing electrodes 33 suitable for one ink jet printhead is enlarged. Prior to patterning the multiple sets of printhead electrodes 33, the resistive material that serves as the heating elements, and the common return 35, the polished surface to receive the heating elements and addressing electrodes is coated with an underglaze layer, such as $SiO_2$, having a thickness of between 5000 Å and one micron. The resistive material may be a doped polycrystalline silicon which may be deposited by chemical vapor deposition (CVD) or any other well known resistive material such as $ZrB_2$. The common return and the addressing electrodes are aluminum leads deposited on the underglaze layer and over the edges of the heating elements. The common return ends 37 and addressing electrodes terminals 32 are positioned at predetermined locations to allow clearance for wire-bonding to the daughter board electrodes 23 after the channel plate 31 (see FIG. 10) is attached to make the printhead. The common return 35 and the addressing electrodes 33 are deposited to a thickness of 0.5 to 3.0 microns, with the preferred thickness being 1.5 microns. For electrode passivation, a 2 micron thick phosphorus doped CVD $SiO_2$ film (not shown) is deposited over the entire plurality of sets of heating elements and addressing electrodes and subsequently etched off of the terminal ends of the common return and addressing electrodes for subsequent connection with the daughter board electrodes by wire-bonding. This etching may be by either the wet or dry etching method. Alternatively, the electrode passivation may be accomplished by plasma deposited $Si_3N_4$.

If polysilicon heating elements are used, they may be subsequently oxidized in steam or oxygen at a relatively high temperature of about 1100° C. for 50 to 80 minutes, prior to the deposition of the aluminum leads, in order to convert a small fraction of the polysilicon to $SiO_2$. In such cases, the heating elements are thermally oxidized to achieve an overglaze (not shown) of $SiO_2$ of about 500 Å to 1 micron which has good integrity with substantially no pin holes.

A tantalum (Ta) layer (not shown) may optionally be deposited to a thickness of about 1 micron on the oxidized polysilicon overglaze or passivation layer for added protection thereof against the cavitational forces generated by the collapsing ink vapor bubbles during the printhead operation. The Ta layer is etched off all but the heating elements using, for example, $CF_4/O_2$ plasma etching. For polysilicon heating elements, the aluminum common return and addressing electrodes are deposited on the underglaze oxide layer and over the opposing edges of the polysilicon heating elements which have been cleared of oxide for the attachment of the common return and electrodes.

At a convenient point after the underglaze is deposited, at least, two alignment markings 38 are photolithographically produced at prdetermined locations on separate lower substrates 28 which substrates make up wafer 36. These alignment markings are used for alignment of the plurality of upper substrates 31 having the channels that make up wafer 39. The surface of the single sided wafer 36 containing the plurality of sets of the heating elements and addressing electrodes are bonded to the wafer 39 after alignment between the wafers, as explained later.

Figure 6A:
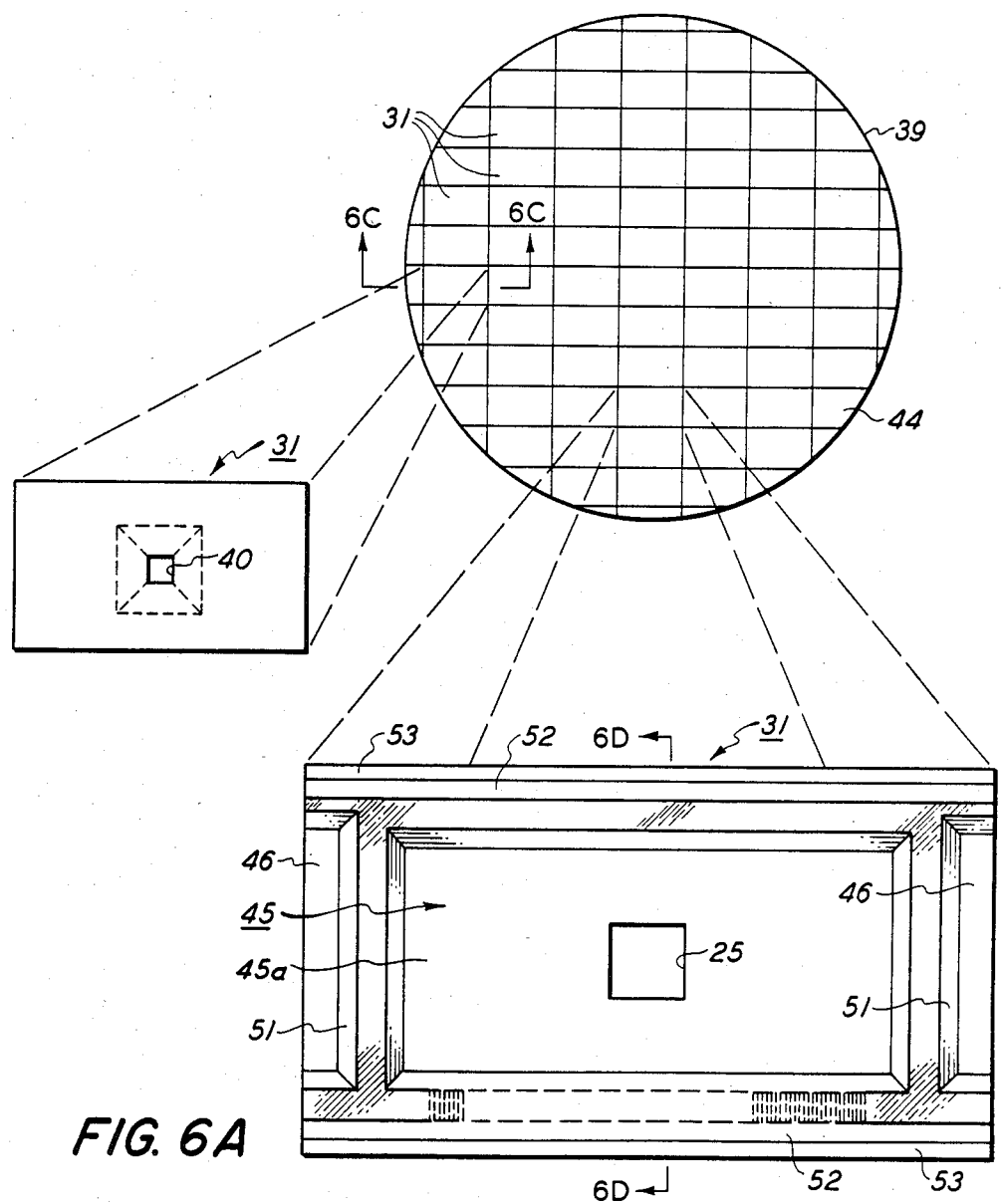
FIG. 6A is a schematic plan view of a wafer having a plurality of ink manifold recesses, with one manifold recess and one alignment opening being shown enlarged.

In FIG. 6A, a two-side-polished, (100) silicon wafer 39 is used to produce the plurality of upper substrates 31 for the printhead. After the wafer is chemically cleaned, a pyrolytic CVD silicon nitride layer 41 (see FIG. 6C) is deposited on both sides. Using conventional photolithography, a via for fill hole 25 for each of the plurality of upper substrates 31 and, at least two vias for alignment openings 40 at predetermined locations are printed on one wafer side 42, opposite the side shown in FIG. 6A. The silicon nitride is plasma etched off of the patterned vias representing the fill holes and alignment openings. A potassium hydroxide (KOH) anisotropic etch is used to etch the fill holes and alignment openings. In this case, the {111} planes of the (100) wafer make an angle of 54.7 degrees with the surface of the wafer. The fill holes are small square surface patterns of about 20 mils per side, and the alignment openings are about 60 to 80 mils square. Thus, the alignment openings are etched entirely through the 20 mil thick wafer, while the fill holes are etched to a terminating apex 43 at about half way to three quarters through the wafer. The relatively small square fill hole is invariant to further size increase with continued etching, so that etching of the alignment openings and fill holes are not significantly time constrained. This etching takes about two hours and many wafers can be simultaneously processed.

Next, the opposite side 44 of wafer 39 is photolithographically patterned, using the previously etched alignment holes as a reference, to form the relatively large rectangular recesses 45 that will eventually become the ink manifolds of the printheads. Also patterned are two recesses 46 between the manifolds in each substrate 31 and adjacent each of the shorter walls 51 of the manifold recesses. Parallel elongated grooves 53 which are parallel and adjacent each longer manifold recess wall 52 extend entirely across the wafer surface 44 and between the manifold recesses of adjacent substrates 31. The elongated grooves do not extend to the edge of the wafer for reasons explained later. The tops 47 of the walls delineating the manifold recesses are portions of the original wafer surface 44 that still contain the silicon nitride layer and forms the streets 47 on which adhesive will be applied later for bonding the two wafers 36, 39 together. The elongated grooves 53 and recesses 46 provide clearance for the printhead electrode terminals during the bonding process discussed later. One of the manifold recess walls 52 of each manifold will later contain grooves 48 which will serve as ink channels as discussed with reference to FIG. 6B. At this stage in the fabrication process, the grooves 48 have not yet been formed, so that they are shown in dashed line in FIG. 6A on top of one of the longer manifold recess walls 52 to assist in understanding where the future channels will be produced. A KOH solution anisotropic etch is used to produce the recess, but, because of the size of the surface pattern, the etching process must be timed to stop the depth of the recesses. Otherwise, the pattern size is so large that the etchant would etch entirely through the wafer. The floor 45a of the manifold recess 45 is determined at a depth where the etching process is stopped. This floor 45a is low enough to meet or slightly surpass the depth of the fill hole apex 43, so that an opening is produced that is suitable for use as the ink fill hole 25.

Figure 6B:
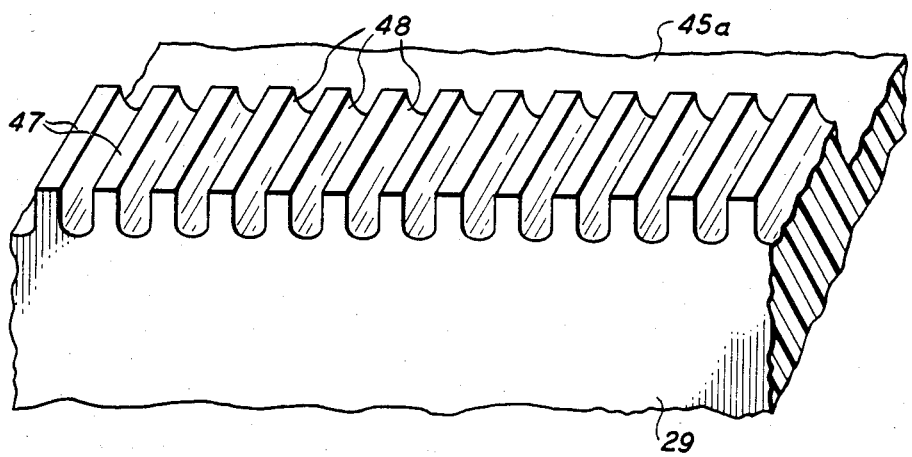
FIG. 6B is an enlarged isometric view of one set of channels which were later diced into one of the manifold recess walls of FIG. 6A.
Figure 6C:
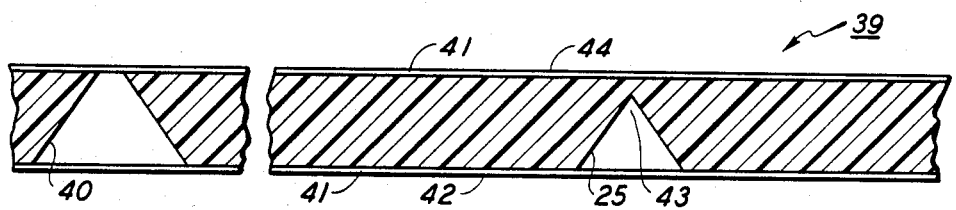
FIG. 6C is an enlarged cross-sectional view of the wafer of FIG. 6A as viewed along the line "C—C" thereof, showing an alignment opening and a recess which will later form the fill hole.
Figure 6D:
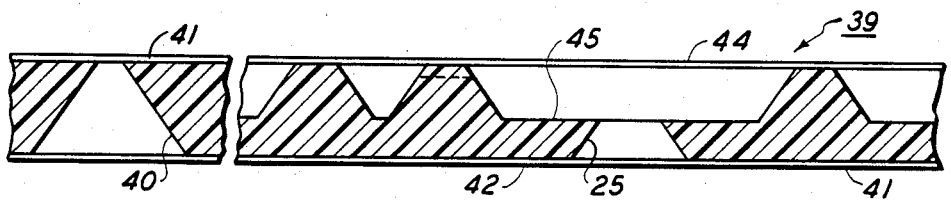
FIG. 6D is a cross-sectional view of the enlarged manifold recess of FIG. 6A as viewed along line "D—D" thereof.

Parallel grooves 48 are milled into a predetermined recess wall 52 by any dicing machine as is well known in the art. Each groove 48 shown in FIG. 6B is about 20 mils long and has a depth and width of about 1 mil. The lineal spacing between axial centerlines of the grooves are about 3 mils. The silicon nitride layer 41 on wafer side 44 forms the bonding surfaces, as discussed earlier, and a coating of an adhesive, such as a thermosetting epoxy, is applied in a manner such that it does not run or spread into the grooves 48 or other recesses.

Figure 10:
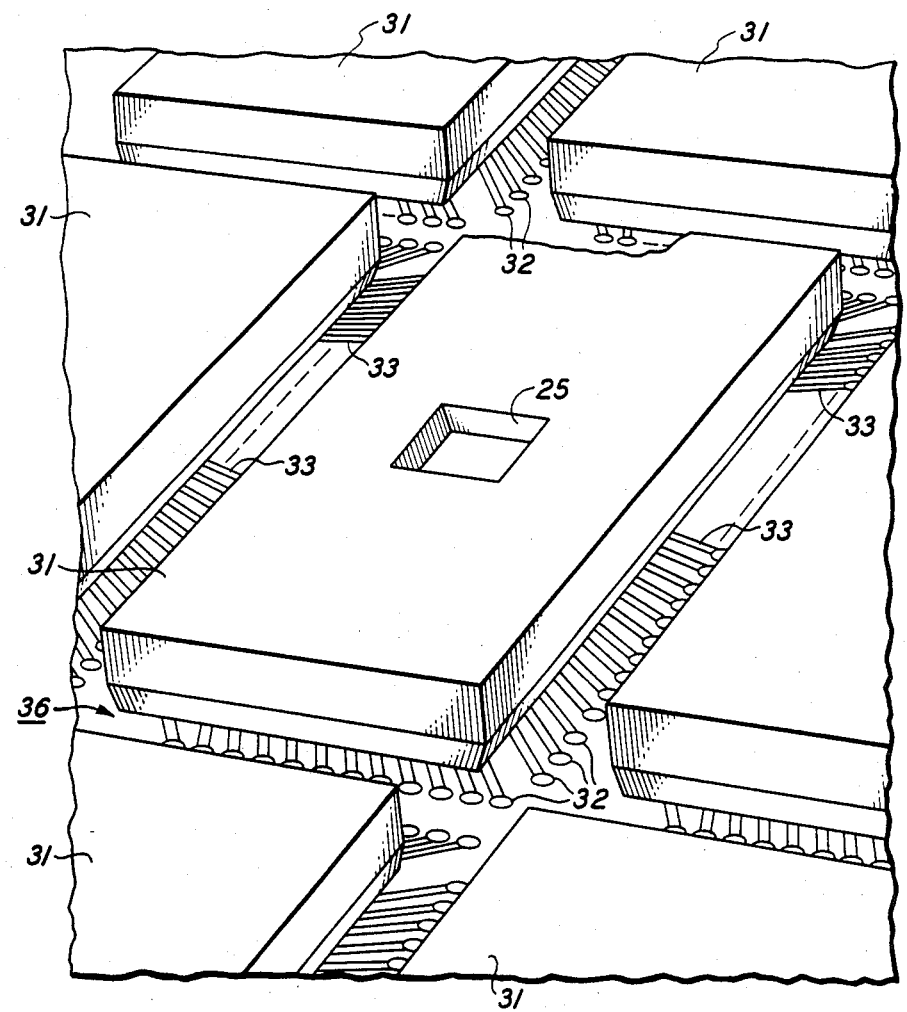
FIG. 10 shows an enlarged isometric view of the channel and manifold wafer bonded to the wafer with the heating elements after the excess channel wafer material has been removed.

The alignment openings 40 are used with a vacuum chuck mask aligner to align the channel wafer 39 via the alignment marks 38 on the heating element and addressing electrode wafer 36. The two wafers are accurately mated and tacked together by partial curing of the adhesive. Alternatively, the heating element and channel wafers 36, 39 can be given precisely diced edges and then manually or automatically aligned in a precision jig. The grooves 48 automatically are positioned by either alignment operation, so that each one has a heating element therein located a predetermined distance from the nozzles or orifices in channel plate edge 29 (see FIG. 4). The two wafers are cured in an oven or a laminator to permanently bond them together and then the channel wafer is milled to produce individual upper substrates with the manifolds and ink channels as shown in FIG. 10. Care is taken not to machine the exposed printhead electrodes terminals 32 which surround the three sides of the manifold that do not have the nozzles. The recesses 46 and elongated grooves greatly assist in preventing damage to the printhead electrodes 33 and terminals 32 by spacing the upper substrate therefrom.

The heating element wafer 36 is then diced to produce a plurality of individual printheads which are bonded to the daughter board and the printhead electrode terminals are wire bonded to the daughter board electrodes.

Figure 7A:
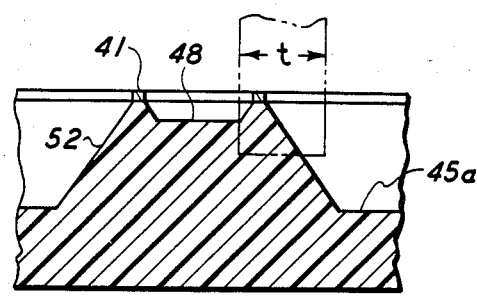
FIG. 7A is an enlarged cross-sectional view of a channel recess as viewed along line "A—A" in the enlarged manifold recess wall of FIG. 7.
Figure 7:
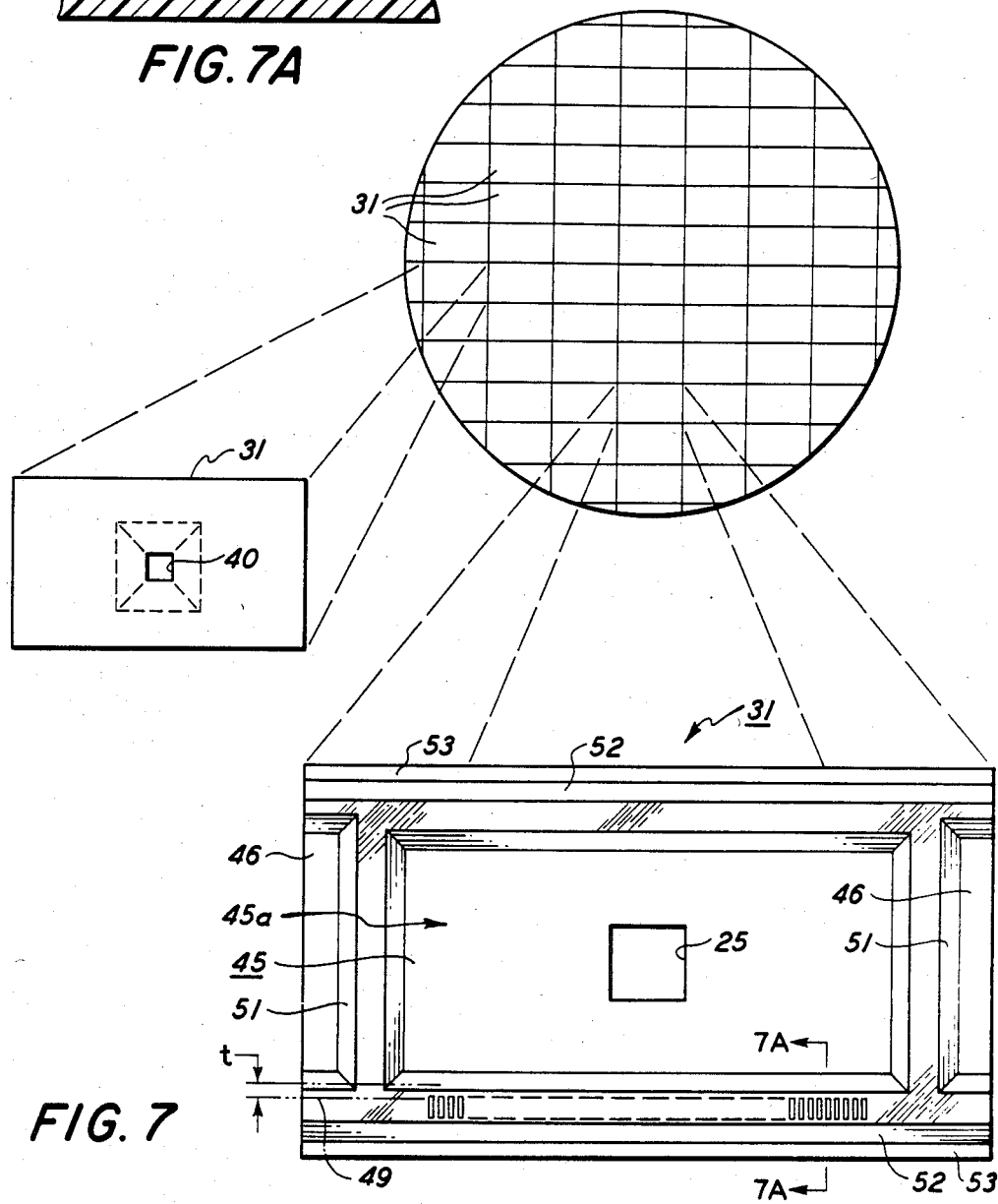
FIG. 7 is a schematic plan view of a wafer having a plurality of ink manifold recesses with the channels concurrently etched therein; this alternate fabrication process also shows one enlarged manifold recess and associated channels, as well as one enlarged alignment opening.

An alternate fabrication embodiment is shown in FIG. 7, where the channel grooves 48 are etched concurrently with the manifold recess 45, recess 46, and elongated grooves 53 which provide the clearance for the printhead electrodes and terminals. The embodiment has like index numerals for like parts and eliminates the need to dice individual channels. This fabricating process requires that parallel milling cuts be made at the end of the channel grooves which are adjacent the manifold recess 45. The milling or dicing cuts are perpendicular to the channel grooves. Of necessity, the cut on the interior side of the manifold recess also cuts a gap 49 in the walls of the manifold recess. These very narrow cuts are filled later during the application of a passivation layer which is accomplished after the printhead is mounted on and wire bonded to the daughter board. With the exception that the channel grooves are etched instead of milled, this embodiment is substantially the same as that described with reference to FIGS. 6A through 6D. The cut on the exterior side of the channels is preferably accomplished after the wafers are bonded together, in the step of dicing out the individual printheads. Thus, the channels are opened and the nozzles are formed in the perpendicular upper substrate face 29 as the individual printheads are diced out of the wafers.

An enlarged cross-sectional view taken along line "A—A" of FIG. 7 is shown in FIG. 7A. A milling cut shown in dashed line has width "t" to open the etched groove 48 to the manifold recess 45. In FIG. 7, the milling or dicing cut will form a gap 49 having width "t" also shown in dashed line.

Anisotropic etching of (100) silicon wafers must always be conducted through square or rectangular vias, so that the etching is along the 111 planes. Thus, each recess or opening has walls at 54.7 degrees with the surface of the wafer. If the square or rectangular opening is small with respect to the wafer thickness a recess is formed. For example, a small etched rectangular surface shape will produce an elongated, V-grooved recess with all walls at 54.7 degrees with the wafer surface. As is well known in the art, only internal corners may be anisotropically etched. External or convex corners do not have {111} planes to guide the etching and the etchant etches away such corners very rapidly. This is why the channels cannot be opened at their ends, but instead must be completed by a separate process, such as milling. The channel recesses may be opened by an isotropic etch of a short predetermined time period, such as two minutes, to undercut the thin nitride mask, followed by a short KOH anisotropic etch, for example, for five minutes, to complete the opening of the channels. Since isotropic etching etches equally in all directions at the same time, this removal of silicon must be taken into account when the anisotropic etching is designed. Because the channels have been isotropically then anisotropically etched opened, the channels walls have been shortened but are still within the desired length of around 20 mils.

Figure 8A:
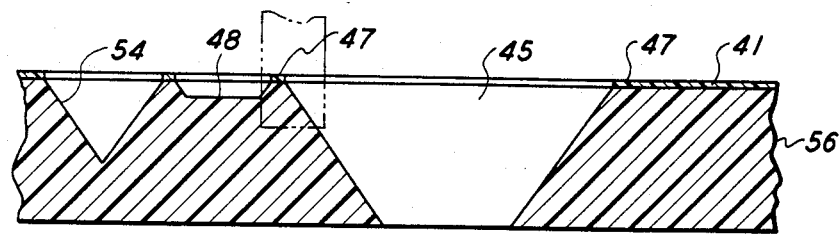
FIG. 8A is an enlarged cross-sectional view of a channel recess as viewed along line "A—A" in the enlarged manifold recess wall of FIG. 8.
Figure 8:
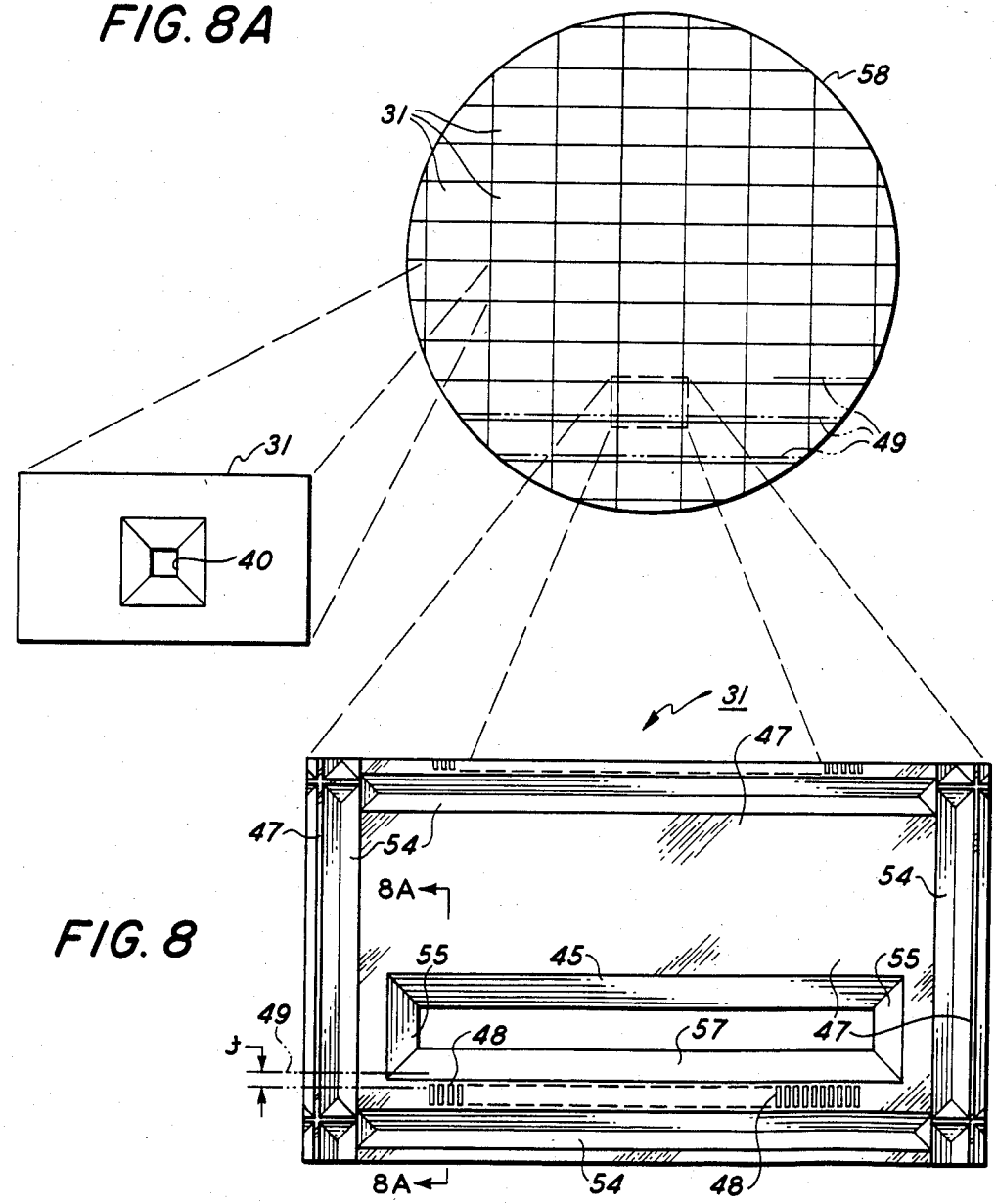
FIG. 8 is an alternate embodiment of FIG. 7 showing all etching from one side of the wafer.

In the preferred alternate fabrication embodiment of FIG. 8, all of the etching is done from one side of the wafer 58. Therefore, only a single-side-polished, (100) wafer 58 is required as was required by the heating element wafer 36. On the chemically cleaned, single-polished surface of the wafer, a layer 41 of pyrolytic CVD silicon nitride is deposited. A mask for the plurality of the manifolds, electrode clearances, channels and alignment openings are printed on the silicon nitride layer using conventional photolithography. The silicon nitride 41 is plasma etched from the printed areas of the mask on surface of the wafer. Next, a KOH anisotropic etch is used to each completely, the wafer. This takes about two hours and many wafers can be simultaneously processed. The etching depth depends upon the surface area of the wafer exposed to the etchant. Only the recesses for the alignment opening 40 and the manifold 45 are sized so that the etchant etches through the wafer. The channels 48 and the electrode terminal clearing recesses 54 converge along the {111} planes and stop at a depth short of the wafer thickness. The channel recesses 48 can be opened to the manifold recess by a milling run perpendicular to the channels to form a gap 49, as in the embodiment of FIG. 7. The gaps 49 extend across the wafer 58 as shown in dashed line and have a thickness "t." The depth of the milling runs are sufficient to open the channels to the manifold recess and one at least equal to the depth of the V-grooves 48. The milling runs also slice through the manifold recess walls 55 that perpendicularly connect to the recess wall 57 with the channels, but this narrow opening is closed later by the printhead passivation layer, so that the manifold produced by the bonding together of the two wafer is sealed except for the fill hole 25 and nozzles 27.

In this preferred embodiment, the channels are opened to the manifold by short, for example, 2 minutes duration, isotropic etching as discussed above with respect to FIG. 7. A well-known isotropic etch is, for example, mixtures of $HF/HNO_3/C_2H_4O_2$. As explained earlier, the isotropic etching removes silicon from the surface contacting the etchant equally in all directions. Thus, the silicon nitride layer forming the mask for the anisotropic etching is undercut at the interior end of the channel (i.e., the end adjacent the manifold recess) since it is proposely made more narrow than the other end, if this technique is to be used instead of dicing the channels open. Again, a short KOH anisotropic etch then removes any silicon that might partially plug the channel-manifold openings. After each etching process, the wafers are cleared using, for example, demineralized water at room temperature.

The original surface of the wafer with silicon nitride layer serves as the bonding area for bonding the two wafers together, one having the plurality of sets of channels with associated manifolds and the other having the plurality of sets of heating elements and addressing electrodes. The bonding area is coated with a thermosetting epoxy resin and then the two wafers are aligned together by using an infrared aligner-bonder which holds the channel wafer and aligns the channel wafer with the heating element wafer. Instead of using alignments holes 40 in the wafer 58, alignment marks (not shown) on this water can be used such as, small etched pits which, because of the angle of their sides defined by the intersection of the {111} planes, are seen as opaque patterns in an infrared microscope. The alignment marks 38 on the wafer having the plurality of sets of heating elements 34 can be aluminum patterns, for example, which are also infrared opaque. Therefore, use of an infrared microscope with infrared opaque markings on each wafer to be aligned is yet another alternative technique to align the two wafers together.

Prior to the alignment of the two wafers, the steets 47 or tops of the manifold recess walls are coated with a layer of adhesive, with care being taken not to permit the adhesive to run or weep into the channels 48.

Figure 9A:
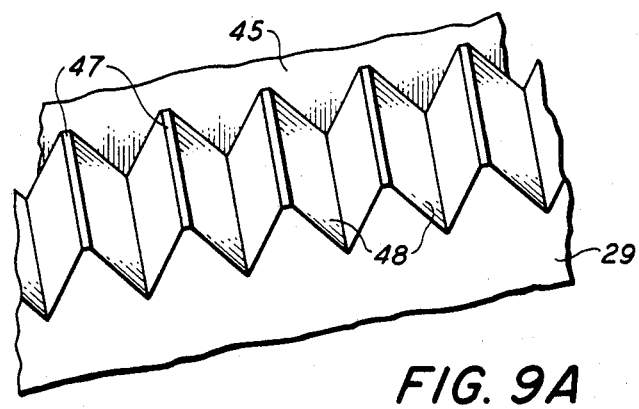
FIG. 9a is an isometric view of an etched set of channels from FIG. 7 or 8 after the channels have been milled open.

The two wafers are tacked together and cured permanently in a laminator. The printhead electrode terminals are cleared by milling the wafer portions as shown in FIG. 10. Next, the heating element wafer is diced into a plurality of individual printheads, which operation also opens the channel ends opposite the manifold recess 45, forming the nozzles 27 in the freshly cut face 29. FIG. 9A is an enlarged, isometric view of the finished printhead with the lower substrate 28 with the heating elements removed to more clearly show the V-shaped channels 48. Each printhead is permanently mounted on a daughter board and the respective electrodes are wire-bonded together. The wire bonds and pads or terminals are coated with a passivation layer of silicone encapsulation compound, such as Dow Corning 3-6550 RTV (Trademark). This layer electrically isolates the electrodes and wire bonds.

Figure 9B:
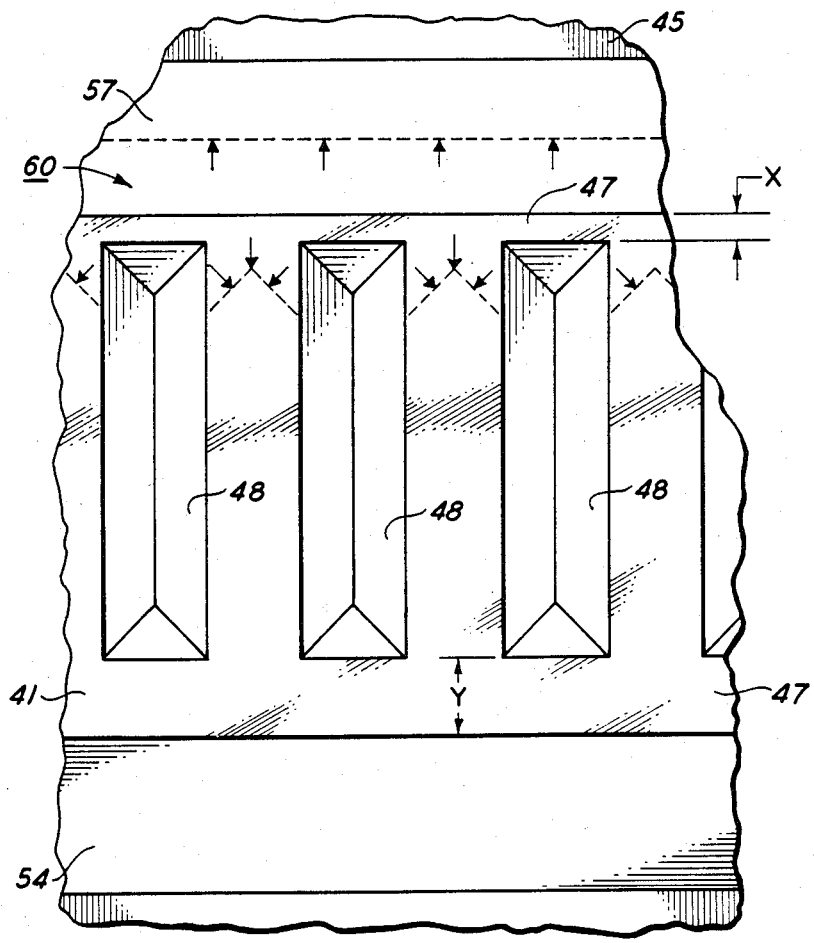
FIG. 9B is an enlarged, partial top view of the channel recesses of FIG. 8.

FIG. 9B is an enlarged partial top view of the channel recesses 48 of FIG. 8 with the region 60 of isotropic-anisotropic etching of the interior ends of the channels shown in dashed line with arrows schematically representing the direction of the etching. Though the isotropic etchant attacks all surface areas, only the region involving the interior ends of the channel recesses 48 is depicted. The silicon nitride layer 41, which forms the mask for the anisotropic etching and serves as the streets 47 for the application of the adhesive, is very narrow at the channel recess ends which are adjacent the manifold recess 45. This distance is shown as "X" distance, generally in the range of 0.2 to 1.0 mil. At the other end, which will ultimately be the nozzles, the distance "Y" is at least twice that of the "X" distance. Thus, while the isotropic etching removes and undercuts the silicon nitride layer at the channel interior ends, it cannot do so at the other wider end. Having anticipated the enlargement and shortening of the channels by using the technique of opening the channels to the manifold by isotropic then anisotropic etching, the use of dicing the interior channel ends to open them to the manifold is avoided.

A variety of combinations of these process steps can be used to fabricate a complete printhead. These combinations are illustrated in Table I for processes using two major etching steps and in Table II for processes using only one major etching step. The sequential process steps in each Table are sequentially numbered. The steps with the same numbers, but coupled with a letter of the alphabet, are alternative steps in the fabricating process. Each subsequent alternate step with like letters must be used for any one process. For example, in Table I, step 6.a must be used when step 4.a is selected rather than either step 6.b.1 or 6.6.2. Note that steps 6.b.1 and 6.b.2 are alternate optional steps for the process using the step 4.b. If the subsequent alternative steps are optional with either the step 4.a or 4.b, then both combinations of numbers and letters are used as in step 8.(a.1 or b.1) and step 8(a.2 or b.2). This numbering approach is used throughout both Table I and Table II to present the various alternative fabricating processes.

TABLE I

| | TWO MAJOR ETCH PROCESS |
|---|---|
| 1. | deposit silicon nitride on (100) wafers. |
| 2. | pattern fill and alignment openings on one wafer side by, for example, plasma etching to form mask. |
| 3. | anisotropic etch fill and alignment openings. |
| 4.a. | pattern manifold and electrode clearance recesses on other side of wafer. |
| 4.b. | pattern manifold, channels, and electrode clearance recesses on other side of wafer. |
| 5. | anisotropic etch these structures. |
| 6.a. | dice individual channels |
| 6.b.1. | dice channel recess ends adjacent manifold recess to open them to manifold. |
| 6.b.2. | isotropically etch to undercut nitride mask at channel end adjacent manifold, then anisotropically etch to completely finish opening each channel end. |
| 7. | apply adhesive to channel plate. |
| 8.(a.1. or b.1.) | using etched alignment openings, align wafer with alignment marks on associated wafer containing heating elements and addressing electrodes, tack together by partially curing adhesive. |
| 8.(a.2. or b.2.) | dice precise edges on both wafer with etched structures and wafer containing heating elements and addressing electrodes, align other wafers using a jig and tack together by partially curing |

TABLE I-continued
TWO MAJOR ETCH PROCESS

|   |   |
|---|---|
|   | adhesive. |
| 9. | permanently bond wafers together by a thermocompressive means. |
| 10. | dice out individual printheads, this step also opens channel ends opposite the manifold, with this open end being the nozzles. |
| 11. | mount printhead on daughter board and wirebond printhead electrodes to electrodes of daughter board. |
| 12. | passivate wirebonds with silicone encapsulation compound. |

TABLE II
ONE MAJOR ETCH STEP PROCESS

|   |   |
|---|---|
| 1. | deposit silicon nitride on (100) wafers. |
| 2.a. | pattern all structures on one side of wafers (manifolds, channels, alignment pits, etc.) |
| 2.b. | use two-sided aligner to simultaneously pattern fill and alignment openings on one side of wafer and remaining structures (manifold, channels, and electrode clearance recesses) on the other side. |
| 3. | anisotropically etch all structures. |
| 4.(a. or b.) | isotropically-anisotropically etch channel ends adjacent manifold to open channels to associated manifold. |
| 4.(a. or b.) | dice channel ends adjacent manifold to open channels to associated manifold. |
| 5. | apply adhesive to nitride surface containing manifold and channels. |
| 6.a.1. | align wafer with channels and associated manifolds with a wafer containing heating elements and addressing electrodes using infrared aligner-bonder. use alignment pits on etched wafer with aluminum marks on wafer with heating elements, tack wafers together by partially curing adhesive. |
| 6.(a.2. or b.2.) | dice edges on wafer with channels and associated manifolds and wafer with heating elements and addressing electrodes, align in a jig, and tack wafers together by partially curing adhesive. |
| 6.b.1. | using etched alignment openings on etched wafer, align with a wafer having heating elements and addressing electrodes by using alignment marks placed at predetermined locations on heating element wafer. |
| 7. | permanently bond wafers together by thermocompressive means. |
| 8. | dice out individual printheads; this opens channel ends opposite manifold and forms nozzles. |
| 9. | mount each printhead on a daughter board and wire bond printhead electrodes to daughter board electrodes. |
| 10. | passivate wirebonds with silicone encapsulation compound. |

Several advantages are obtained by this fabrication approach. The microfabrication of the channel plate batches by chemical anisotropic etching in inexpensive and the channels are of uniform size, independent of wafer thickness or various in thickness. The channel placement is accurate, especially when delineated with lithographic resolution. The heating elements are accurately aligned in the channels because of the wafer to wafer alignment using the alignment openings in the channel plate and the alignment marks on the heating element plate or, alternatively, the infrared opaque alignment marks. Since the heating elements and addressing electrodes are patterned on silicon wafers, mating anisotropically etched silicon channels and manifold eliminates any potential error due to thermal expansion differences during printhead operation. One major advantage is that batch processing is practical; 100 wafers of 100 mm diameter can be simultaneously etched with about 250 discrete printhead parts per wafer, thus providing around 50,000 parts per batch.

Many modifications are variations are apparent from the foregoing description of the invention and all such modifications and variations are intended to be within the scope of the present invention.

We claim:

1. A method for fabricating a printhead for use in an ink jet printing device, comprising the steps of:
    (a) cleaning first and second silicon substrates, each having first and second parallel surfaces, the substrate surfaces being {100} planes;
    (b) depositing a layer of insulating material on the surfaces of the substrates;
    (c) forming an equally spaced, linear array of resistive material on the first surface of the first substrate for use as heating elements and forming a pattern of electrodes on the same substrate surface for enabling individual addressing of each heating element with current pulses;
    (d) photolithographically patterning the insulative layer on the first surface of the second substrate to produce at least one via therein for orientation dependent etching of at least one recess in the second substrate bounded by {111} plane side walls;
    (e) forming a plurality of equally spaced, parallel grooves in the first surface of the second substrate, one end of the grooves communicate with the recess and the other ends of the grooves are open;
    (f) applying an adhesive to the insulative layer on the first surface of the second substrate, taking care not to permit the adhesive to run into the recess or grooves;
    (g) aligning the first and second substrates with their first surfaces confronting and contacting each other, so that each groove contains a heating element therein spaced a predetermined distance from the groove open end; and
    (h) curing the adhesive to bond the first and second substrates together to form the printhead, wherein the recess serves as an ink supplying manifold, the grooves serve as capillary filled channels, and the groove open ends serve as the printhead nozzles.

2. The method of claim 1, wherein step (d) further comprises:
    photolithographically patterning the insulative layer on the second surface of the second substrate to enable orientation dependent etching of a second recess in said second substrate bounded by {111} plane side walls, this second recess is deep enough to penetrate the floor of the recess in the first surface of the second substrate to provide an aperture for use as a fill hole to fill and maintain ink in said manifold.

3. The method of claim 1, wherein the method further comprises providing means on each of the first and second substrates for aligning them together.

4. The method of claim 3, wherein the means provided for alignment is accurately dicing two adjacent corners on each substrate for use in alignment of the two substrates in a jig.

5. The method of claim 3 wherein the means provided for alignment is at least two patterned alignment marks on the first substrate first surface with the heating elements and addressing electrodes, the alignment marks being placed at predetermined locations and at least two patterned via in the insulative layer on the first surface of the second substrate at predetermined locations in order for alignment pits to the etched in the second substrate, and wherein an infrared aligner may be used to align the two substrates by aid of the alignment marks and alignment pits.

6. The method of claim 1, wherein the via patterned in step (d) is sized so that the orientation dependent etching etches entirely through the second substrate, the open bottom of the recess being for use as a fill hole for the subsequently formed manifold.

7. The method of claim 1, wherein the grooves of step (e) are formed by concurrent orientation dependent etching with the recess of step (d) by patterning a plurality of narrow, equally spaced, elongated vias in the insulative layer spaced from and perpendicular to the recess via, the etched grooves being bounded by {111} plane side walls, the longer side walls converging to form grooves with a V-shaped cross-section, and wherein both ends of the grooves are diced open, so that the groove ends closer to the recess are in communication therewith and the other ends are open to serve as nozzles.

8. The method of claim 1, wherein the grooves of step (e) are formed by concurrent orientation dependent etching with the recess of step (d) by patterning a plurality of relatively narrow, equally spaced, elongated vias in the insulative layer spaced from and perpendicular to the recess via, the distance between the ends of the grooves closer to the recess being shorter than the distance between the other ends of the grooves from a one of the second substrate edges, the etched grooves being bounded by {111} plane side walls, and wherein the ends of the grooves adjacent the recess are opened to the recess by first isotropic etching of the second substrate for a period of time sufficient to permit undercutting of the insulative layer between the grooves and the recess, cleaning the second substrate to stop the isotropic etching process, and then orientation dependent etching of the second substrate a second time in order to open the grooves to the recess since the undercut region is exposed to the orientation dependent etchant, the other ends of the grooves being subsequently diced opened to form the nozzles.

9. The method of claim 1, which further comprises the steps of:
(i) mounting the printhead on an insulating board having a plurality of electrodes thereon which correspond in numbers to the addressing electrodes of the printhead, the insulating board electrodes having an input end and a terminal end;
(j) wirebonding each printhead electrode to a corresponding one of the insulating board electrode input ends; and
(k) passivating the wirebonds with a silicone encapsulation compound.

10. The method of claim 9, which further comprises the steps of:
(l) attaching the insulating board and mounted printhead, after their electrodes have been wirebonded and passivated, to an ink supply cartridge in such a manner that the ink in the cartridge maintains the ink in the printhead at a predetermined pressure, the cartridge, insulating board, and printhead assembly being suitable for installation in an ink jet printer.

11. A method for fabricating a plurality of printheads, each printhead being usable in an ink jet printing device for emitting and propelling ink droplets toward a recording medium, the method comprising the steps of:

(a) cleaning first and second (100) silicon wafers, each having first and second substantially parallel surfaces;
(b) depositing a layer of insulative material on the surfaces of the wafers;
(c) forming a plurality of sets of equally spaced, linear arrays of resistive material on the insulative layer on the first surface of the first wafer for use as sets of heating elements, and forming a plurality of sets of addressing electrodes on the same wafer surface for enabling individual addressing of each heating element with current pulse;
(d) photolithographically patterning the insulative layer on the first surface of the second wafer to produce a plurality of set of vias of predetermined sizes and at predetermined locations thereon;
(e) anisotropic etching of the second wafer to produce sets of recesses in its first surface, each recess being bounded by {111} plane side walls;
(f) forming a plurality of sets of equally spaced, parallel grooves through the first surface of the second wafer and its insulative layer, each groove having a predetermined depth and first and second ends, the first ends of each set of grooves communicating with an associated one of the set of recesses, the second ends of each set of grooves opening into another of the set of recesses;
(g) applying an adhesive on the remaining unetched insulative layer of the first surface of the second wafer, so that the adhesive does not run into any of the grooves or recesses;
(h) aligning the first and second wafers with their first surfaces confronting and contacting each other with the adhesive sandwiched therebetween, the alignment assuring that each groove contains a one of the heating elements spaced a predetermined distance from the second open ends thereof;
(i) curing the adhesive to bond the first and second wafers together, so that each recess in the set of recesses communicating with a set of grooves serves as an ink supplying manifold, while each set of grooves serves as capillary filling channels, with its second open ends serving as nozzles; and
(j) dicing the bonded wafers into a plurality of individual printheads, each printhead having a manifold, a set of channels communicating with the manifold at one end thereof and having nozzles at the other end with heating elements in each a predetermined distance from the nozzles, and addressing electrodes for selectively addressing the heating elements.

12. The method of claim 11, wherein the method further comprises the step of:
providing means on each of the first and second wafers for aligning them together.

13. The method of claim 12, wherein the means for providing alignment is the accurate dicing of the wafers so that each has intersecting edges that produce corners thereon for use in the alignment of the two wafers in a jig.

14. The method of claim 12, wherein the means for providing alignment is accomplished by the placement of at least two alignment marks on the first surface of the first wafer during the forming of the addressing electrodes in step (c), the alignment marks being placed at predetermined locations on the first surface of the first wafer, and wherein at least two relatively small vias are patterned in the insulative layer of the first surface of the second wafer at predetermined locations, in order that alignment pits may be anisotropically etched therein during step (e), so that alignment of the first and second wafers may be conducted by an infrared aligner which would view the alignment marks and alignment pits as opaque objects, while the silicon wafer surrounding the alignment marks and pits would be viewed as transparent to the infrared light of the infrared aligner.

15. The method of claim 12, wherein step (d) further comprises:

photolithographically patterning the insulating layer on the second surface of the second wafer to produce a plurality of vias therein at predetermined locations, so that at step (e), the vias in the second wafer second surface are etched anisotropically concurrently with those in the first surface of the second wafer.

16. The second of claim 15, wherein at least two of the vias in the second surface of the second wafer are located and sized for anisotropic etching through the wafer to produce alignment openings suitable for enabling visual alignment of the second wafer with the first wafer, and wherein the remainder of the vias in the second surface of the second wafer are sized and positioned to coincide with a selected one of the vias in each set of vias on the first surface of the second wafer, in order that the anisotropic etching during step (e) produces a through-hole in each of the selected recesses of the first surface of the second wafer, this through-hole later serving as an ink filling hole.

17. The method of claim 16, wherein step (c) further comprises the forming of at least two alignment marks at predetermined locations on the first surface of the first wafer for use with the alignment openings in the second wafer for alignment therewith.

18. The method of claim 12, wherein the step of forming a plurality of sets of grooves is accomplished by dicing.

19. The method of claim 12, wherein the step (f) of forming a plurality of sets of grooves is accomplished by patterning a plurality of sets of elongated vias in the insulative layer on the first surface of the second wafer concurrently with the patterning of the plurality of sets of vias during step (d), each set of elongated vias being located adjacent but spaced from a selected one of the vias of the set of vias of step (d) and being perpendicular to the closest edge of the selected vias, and the grooves being produced during step (e) wherein the second wafer is anistropically etched at all locations not protected by the insulative layer to form recesses bounded by {111} plane side walls, the elongated vias being sized to produce grooves that have longer side walls which converge and make grooves with a V-shaped cross-section but that have closed ends, the closed ends of the grooves adjacent the selected recesses being opened to the selected recess by dicing prior to step (g) and the other closed end of the groove which is to serve eventually as nozzles being opened during step (j) when the plurality of individual printheads are obtained.

20. The method of claim 19, wherein the closed ends of the grooves adjacent the selected recess are opened by isotropic etching the second wafer for a period of time sufficient to undercut the insulative layer between the grooves and its selected recess, cleaning the second wafer to remove the isotropic etch, and then anisotropic etching the second wafer again to open the grooves to its selected recess.

* * * * *